United States Patent [19]

Horie et al.

[11] 3,969,748
[45] July 13, 1976

[54] INTEGRATED MULTIPLE TRANSISTORS WITH DIFFERENT CURRENT GAINS

[75] Inventors: Noboru Horie, Kodaira; Kazuo Hoya, Kokubunji, both of Japan

[73] Assignee: Hitachi, Ltd., Japan

[22] Filed: May 31, 1974

[21] Appl. No.: 475,179

[30] Foreign Application Priority Data
June 1, 1973 Japan .............................. 48-60880

[52] U.S. Cl. ................................. 357/46; 357/34; 357/35; 357/36; 357/40; 357/48; 357/86
[51] Int. Cl.² ................ H01L 27/02; H01L 27/04; H01L 29/72
[58] Field of Search .................. 357/34, 35, 40, 46, 357/86, 36

[56] References Cited
UNITED STATES PATENTS

| | | | |
|---|---|---|---|
| 3,233,125 | 2/1966 | Buie | 357/86 |
| 3,283,170 | 11/1966 | Buie | 357/34 |
| 3,391,311 | 7/1968 | Lin et al. | 357/86 |
| 3,510,735 | 5/1970 | Potter | 357/48 |
| 3,566,218 | 2/1971 | Widlar et al. | 357/48 |
| 3,609,479 | 9/1971 | Lin et al. | 357/35 |
| 3,631,309 | 12/1971 | Myers | 357/36 |
| 3,683,270 | 8/1972 | Mattis | 357/35 |
| 3,761,898 | 9/1973 | Pao | 357/36 |
| 3,766,449 | 10/1973 | Bruchez | 357/36 |

*Primary Examiner*—William D. Larkins
*Assistant Examiner*—Gene M. Munson
*Attorney, Agent, or Firm*—Craig & Antonelli

[57] ABSTRACT

A multiple transistor consists of vertical and lateral transistors, the collector region of the lateral transistor is formed by diffusion within the diffused base region of the vertical transistor simultaneously with the emitter region of the vertical transistor, into a structure in which the base of the vertical transistor and the collector of the lateral transistor are short-circuited. As a result the current gain of the lateral transistor can be varied by changing the area of the collector region.

6 Claims, 2 Drawing Figures

3,969,748

INTEGRATED MULTIPLE TRANSISTORS WITH DIFFERENT CURRENT GAINS

BACKGROUND OF THE INVENTION

1. Field of the Invention

The present invention relates to a multiple transistor consisting of a vertical transistor and a lateral transistor, and also to a method of manufacturing the multiple transistor.

2. Description of the Prior Art

In general, where a plurality of vertical transistors, each having a different current gains ($h_{FE}$) are formed within a semiconductor wafer or chip by the use of a diffusion process, the $h_{FE}$s of of the respective transistors do not considerably differ, even when the emitter area is varied using the same pattern. Therefore, unless the number of diffusion steps is increased to make the base width and the emitter impurity concentration different, transistors having different $h_{FE}$s cannot be formed. An increase in the number of diffusion steps, however, is unpreferable due to a decrease in the yield of finished products and an increase in cost.

For such reasons, it has been impossible to manufacture transistors having arbitrary $h_{FE}$s within a semiconductor wafer or chip under the same diffusion conditions, and hence, the degree of freedom in design for $h_{FE}$ has been low.

SUMMARY OF THE INVENTION

It is, accordingly, an object of the present invention to provide a multiple transistor in which the transistor current gain ($h_{FE}$) is determinably established and any desired $h_{FE}$ can be attained without changing the diffusion conditions, and a method of manufacturing the multiple transistor.

According to one aspect of the present invention, the diffusion of the collector regions for lateral transistors is carried out simultaneously with the diffusion of the emitter regions for vertical transistors into the diffused base regions of the vertical transistors, so as to form a structure in which the base of the vertical transistor and the collector of the corresponding lateral transistor are electrically connected with each other, whereby multiple transistors of different $h_{FE}$s are produced by arbitrarily selecting the areas of the collector regions of the lateral transistors using the same diffusion pattern.

BRIEF DESCRIPTION OF THE DRAWINGS

FIG. 1 is a schematic sectional view of N-P-N multiple transistors for illustrating an embodiment of the present invention, while

PREFERRED EMBODIMENT OF THE INVENTION

Figure 1:
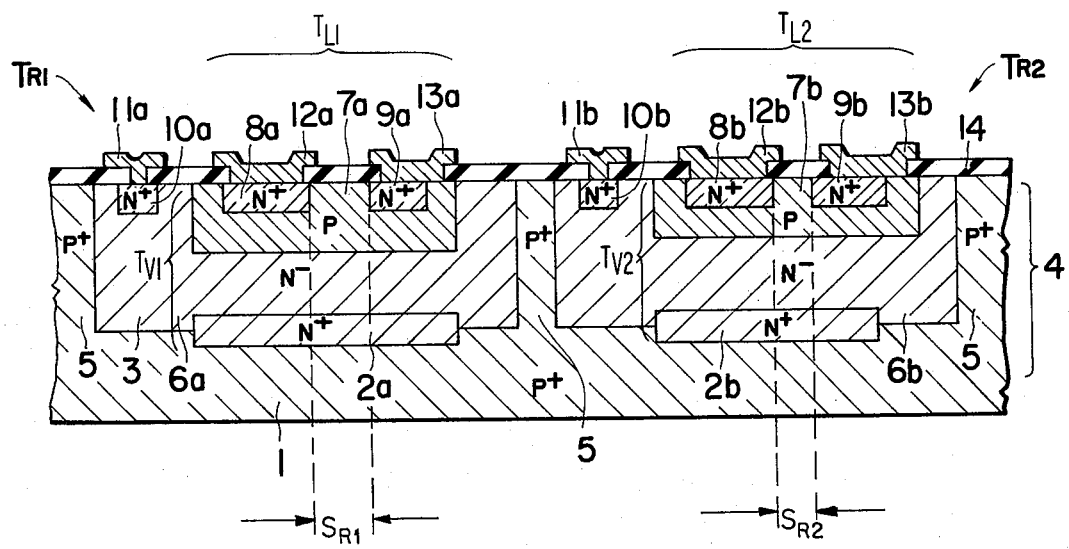

FIG. 1 shows an embodiment of the multiple transistor structure according to the present invention, specifically the structure of N-P-N multiple transistors each of which has a different current gain ($h_{FE}$).

Referring to the figure, numeral 1 designates a P-type semiconductor substrate, on which N$^+$-type buried layers 2a and 2b are selectively formed. An N$^-$-type vapor grown layer 3 is formed on the semiconductor substrate 1 including the buried layers 2a and 2b by vapor growth. During the growth of layer 3, buried layers 2a and 3a slightly outdiffuse into layer 3. Numeral 4 indicates a semiconductor wafer which consists of the P$^+$-type semiconductor substrate 1 and the N$^-$-type vaporgrown layer 3. A P$^+$-type isolation layer 5 is formed so as to extend from the surface of the N$^-$-type vapor-grown layer 3 to the P$^+$-type semiconductor substrate 1. For the respective transistors $T_{R1}$ and $T_{R2}$, N$^-$-type collector regions 6a and 6b are made up of vapor-grown layers which are respectively surrounded by the P$^+$-type insulating layers 5. P-type base regions 7a and 7b are respectively formed in the surfaces of the N$^-$-type collector regions 6a and 6b by diffusion. A first N$^+$-type region 8a and a second N$^+$-type region 9a are simultaneously formed in the surface of the base region 7a in a spaced apart manner by diffusion. On the other hand, a first N$^+$-type region 8b and a second N$^+$-type region 9b are simultaneously formed within the base region 7b in a spaced-apart manner by diffusion. Shown at 10a and 10b are electrical contact N$^+$ regions for the collectors. 11a and 11b denote collector electrodes, 12a and 12b emitter electrodes, and 13a and 13b base electrodes. An insulating protective film 14 made of, for example silicon dioxide is formed on the surface of the structure.

In the above structure, a vertical transistor $T_{V1}$ is constructed of the N$^-$-type collector region 6a, the P-type base region 7a and the first N$^+$-type region 8a. Another vertical transistor $T_{V2}$ is constructed of the N$^-$-type collector region 6b, the P-type base region 7b and the first N$^+$-type region 8b. The first regions 8a and 8b are emitter regions in the respective vertical transistors $T_{V1}$ and $T_{V2}$.

Further, the P-type base region 7a, the first N$^+$-type region (emitter region) 8a and the second N$^+$-type region 9a constitute a lateral transistor $T_{L1}$. The P-type base region 7b, the first N$^+$-type region (emitter region) 8b and the second N$^+$-type region 9b constitute another lateral transistor $T_{L2}$. The second regions 9a and 9b are collector regions in the respective lateral transistors $T_{L1}$ and $T_{L2}$.

A multiple transistor $T_{R1}$ is composed of the vertical transistor $T_{V1}$ and the lateral transistor $T_{L1}$. The base region 7a and the emitter region 8a are common to the transistors $T_{V1}$ and $T_{L1}$. The base region 7a and the collector region 9a are directly connected electrically by the base electrode 13a. On the other side, a multiple transistor $T_{R2}$ is composed of the vertical transistor $T_{V2}$ and the lateral transistor $T_{L2}$. The base region 7b and the emitter region 8b are common to the transistors $T_{V2}$ and $T_{L2}$. The base region 7b and the collector region 9b are directly connected electrically by the base electrode 13b.

The multiple transistors $T_{R1}$ and $T_{R2}$ are formed according to the same diffusion conditions. In addition, the second regions 9a and 9b (the collector regions of the lateral transistors $T_{L1}$ and $T_{L2}$) are formed so that the sizes (areas, peripheral lengths) and/or the spacings from the first regions 8a and 8b may differ. For purposes of illustration, the spacings between the second regions 9a and 9b and first regions 8a and 8b in multiple transistors $T_{R1}$ and $T_{R2}$, respectively, as shown as spacings $S_{R1}$ and $S_{R2}$.

As an exemplary embodiment, the areas, peripheral lengths and spacings of the second region 9a are designed to be of 200$\mu^2$, 60$\mu$ and 10$\mu$, respectively. On the other hand, the values of the second region 9b are designed to be of 200$\mu^2$, 60$\mu$ and 5$\mu$, respectively.

Figure 2:
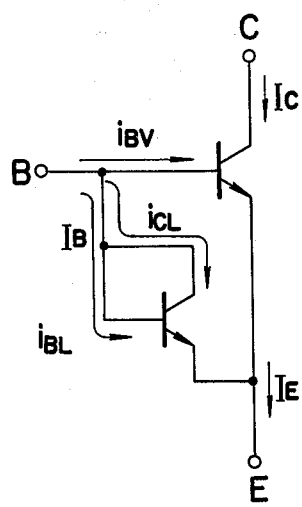
FIG. 2 is an equivalent circuit diagram of the N-P-N multiple transistor shown in FIG. 1.

Electrically, the equivalent circuit of the multiple transistor $T_{R1}$ in the embodiment can be shown as in FIG. 2. The emitter terminals and the base terminals of the vertical transistor $T_{V1}$ and the lateral transistor $T_{L1}$ are connected in common. The collector terminal of the lateral transistor $T_{L1}$ is connected to the base terminal thereof.

Now, let E, B and C indicate the emitter, base and collector terminals of the multiple transistor $T_{R1}$, respectively. Let $I_E$ be the emitter current, $I_B$ be the base current and $I_C$ be the collector current. Further, let $i_{BV}$ be the base current and $h_{FEV}$ be the current gain of the vertical transistor $T_{V1}$, and let $i_{BL}$ be the base current, $i_{CL}$ be the collector current and $h_{FEL}$ be the current gain of the lateral transistor $T_{L1}$. Then, $$I_C = i_{BV} \cdot h_{FEV}, \quad I_{CL} = i_{BL} \cdot h_{FEL}$$

Accordingly, the overall current gain $h_{FE}$ of the multiple transistor $T_{R1}$ becomes:

$$h_{FE} = \frac{I_C}{I_B} = \frac{i_{BV} \cdot h_{FEV}}{i_{BV} + i_{BL} + i_{BL} \cdot h_{FEL}}$$

$$= \frac{h_{FEV}}{1 + (1 + h_{FEL}) \cdot (i_{BL}/i_{BV})}$$

where $I_B = i_{BV} + i_{CL} + i_{BL}$.

From this relationship, the values $h_{FEL}$ and $i_{BL}$ of the lateral transistor $T_L$ are constants which are determined by the structure thereof. The constants are determined by selecting the structure of the second region 9a (the collector region of the lateral transistor). The multiple transistor $T_{R2}$ can be similarly analyzed. In this case, the values $h_{FEV}$ and $i_{BL}$ of the lateral transistor $T_{L2}$ can be determined by the structure of the second region 9b.

The embodiment described above, is not limited to N-P-N type transistors, but P-N-P transistors may also be employed. The electrical connection between the base of the vertical transistor and the collector of the lateral transistor can also be made at a part closer to the emitter junction. The collector region of the lateral transistor can also be formed so as to surround the emitter region of the vertical transistor. Also, both transistors may be formed in separate regions and connected as shown in FIG. 2.

Thus, with the multiple transistor according to the present invention, a semiconductor device in which the current gains ($h_{FE}$) of the multiple transistors differ within the range of the maximum value of $h_{FE}$ of the vertical transistor can be produced.

A multiple transistor of arbitrary $h_{FE}$ can be produced by the emitter diffusion techniques of the prior art, and the degree of freedom in design is increased.

Furthermore, if the present invention is applied to a plurality of vertical transistors within the same semiconductor chip, multiple transistors having various $h_{FE}$s can be formed.

While we have shown and described one embodiment in accordance with the present invention, it is understood that the same is not limited thereto but is susceptible of numerous changes and modifications as known to a person skilled in the art, and We, therefore, do not wish to be limited to the details shown and described herein but intend to cover all such changes and modifications as are obvious to one of ordinary skill in the art.

We claim:

1. An integrated circuit comprising:
    a first multiple transistor and a second multiple transistor, which are formed in the same semiconductor body, each of which multiple transistors comprises:
    a vertical transistor having a collector region of a first conductivity type, a base region of a second conductivity type formed in said collector region, and an emitter region of the first conductivity type formed in said base region; and
    a lateral transistor having a base region of the second conductivity type, and an emitter region and a collector region of the first conductivity type laterally disposed in the surface of said base region, the base region of said lateral transistor being connected to the collector region of said lateral transistor and to the base region of said vertical transistor, the emitter region of said lateral transistor being connected to the emitter region of the vertical transistor; and wherein
    the lateral transistors of said first and second multiple transistors have respectively different current amplification factors.

2. A multiple transistor integrated circuit device including a semiconductor body and first and second multiple transistors formed in different portions of said body, each of said multiple transistors having a vertical and a lateral transistor portion and comprising:
    a first semiconductor layer, of a first conductivity type, as the collector region of said vertical transistor;
    a first semiconductor region of a second conductivity type, opposite said first conductivity type, disposed in a surface portion of said first semiconductor layer, as the common base region of said vertical transistor and said lateral transistor; and
    second and third semiconductor regions of said first conductivity type formed in spaced apart surface portions of said first semiconductor region, said second region being the emitter region of each of said vertical and lateral transistors and said third region being the collector region of said lateral transistor, and wherein said first and third regions are short circuited to each other; and wherein
    the lateral transistors in said first and second multiple transistors are different from one another with respect to at least one of the base width, which is the distance between said second and third regions, and the area and peripheral length of said third region.

3. A multiple transistor integrated circuit device according to claim 2, wherein each of said multiple transistors further includes a semiconductor substrate of said second conductivity type, upon which said first semiconductor layer is disposed, and a buried fourth semiconductor region of said first conductivity type overlapping the interface of said first semiconductor layer and said substrate beneath said first semiconductor region.

4. A multiple transistor integrated circuit device according to claim 2, wherein the distance between the second and third semiconductor regions of said first multiple transistor is greater than the distance between the second and third semiconductor regions of said second multiple transistor.

5. A multiple transistor integrated circuit device according to claim 4, wherein the surface area of the third semiconductor region of said first multiple transistor is different from the surface area of the third semiconductor region of said second multiple transistor.

6. A multiple transistor integrated circuit device according to claim 2, wherein the surface area of the third semiconductor region of said first multiple transistor is different from the surface area of the third semiconductor region of said second multiple transistor.

* * * * *